United States Patent [19]

Manning

[11] 4,020,469

[45] Apr. 26, 1977

[54] PROGRAMMABLE ARRAYS

[76] Inventor: Frank Manning, Apartment 6, 30 Littell Road, Brookline, Mass. 02146

[22] Filed: Apr. 9, 1975

[21] Appl. No.: 566,304

[52] U.S. Cl. .................... 340/172.5; 340/173 R
[51] Int. Cl.² ............... G06F 13/00; G11C 5/02; G11C 5/06; G11C 7/00
[58] Field of Search .......... 235/153 AC; 340/172.5

[56] References Cited

UNITED STATES PATENTS

| | | | |
|---|---|---|---|
| 3,106,698 | 10/1963 | Unger | 340/172.5 |
| 3,287,702 | 11/1966 | Borck et al. | 340/172.5 |
| 3,287,703 | 11/1966 | Slotnick | 340/172.5 |
| 3,473,160 | 10/1969 | Wahlstrom | 340/172.5 |
| 3,810,577 | 5/1974 | Drescher et al. | 235/153 AC |

*Primary Examiner*—R. Stephen Dildine, Jr.

*Attorney, Agent, or Firm*—Rines and Rines; Shapiro and Shapiro

[57] ABSTRACT

Iterative units of an array are programmed for selected processing functions, for unit testing, and for avoidance of defective units, by loading mechanisms which permit a unit to be programmed and then to extend a loading path to an adjacent unit, so that loading paths may be established directly from unit to unit, with the loaded units serving as wires to transmit loading information to a unit to be loaded. After loading, the loading paths may be retracted (disconnected) leaving the loaded units in condition for the performance of desired processing functions. For example, the loaded units may form one or more shift registers, may serve as wires for transmitting test signals to and from a unit to be tested, and may be arranged to avoid defective units.

27 Claims, 35 Drawing Figures

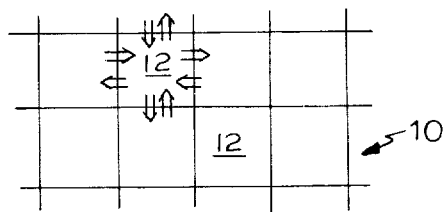
FIG.1
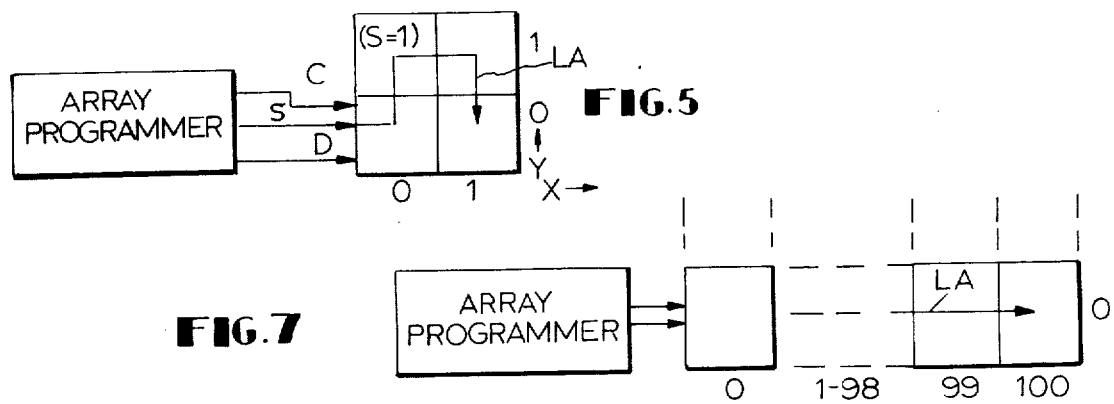
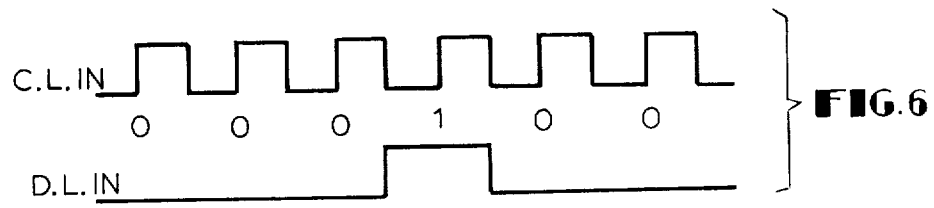
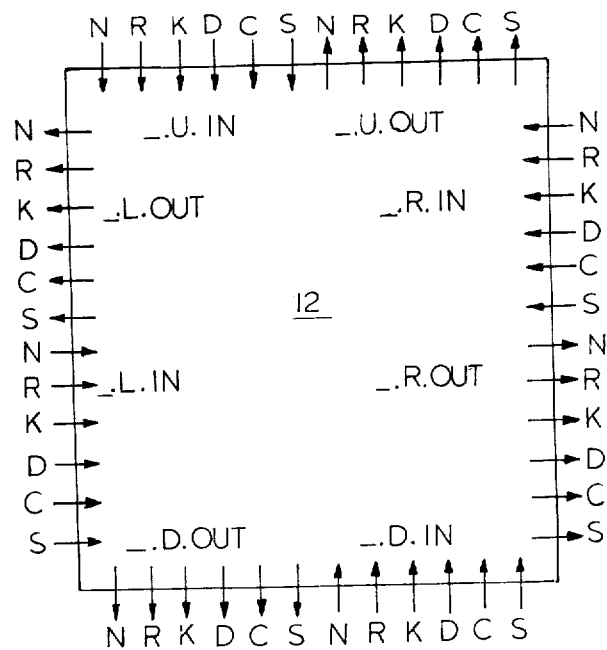

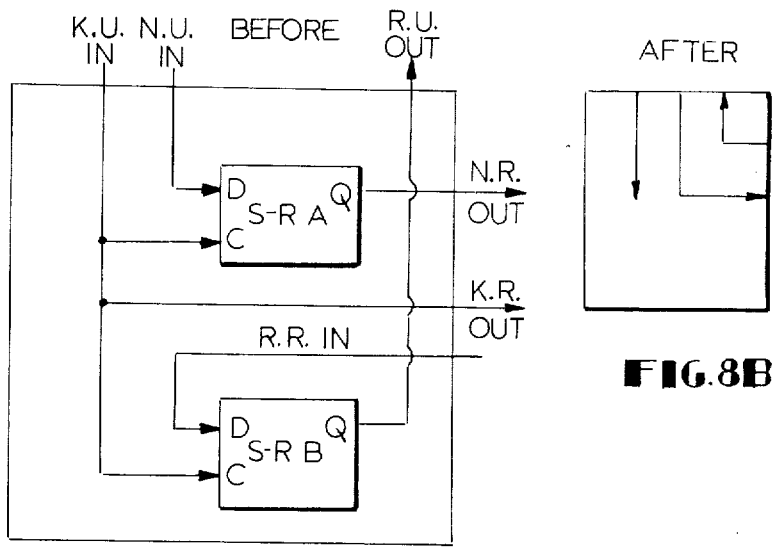
FIG.8A
FIG.8B
(0000) 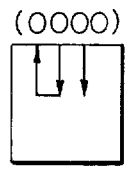
FIG.9A
(0010) 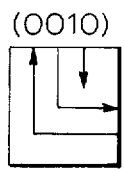
FIG.9B
(0001) 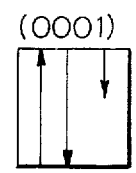
FIG.9C
(0011) 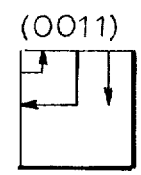
FIG.9D
(1000) 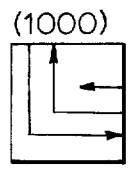
FIG.9E
(1010) 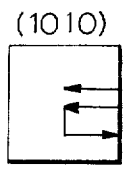
FIG.9F
(1001) 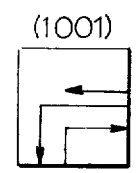
FIG.9G
(1011) 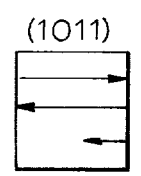
FIG.9H
(0100) 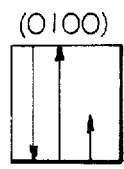
FIG.9I
(0110) 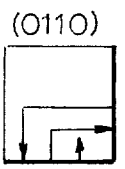
FIG.9J
(0101) 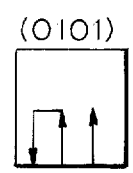
FIG.9K
(0111) 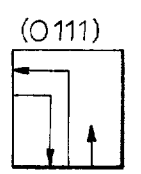
FIG.9L
(1100) 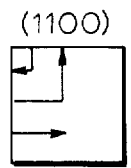
FIG.9M
(1110) 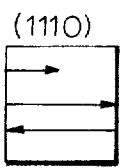
FIG.9N
(1101) 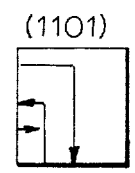
FIG.9O
(1111) 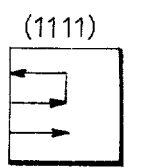
FIG.9P

PROGRAMMABLE ARRAYS

BACKGROUND OF THE INVENTION

This invention relates to programmable arrays of units, such as digital machinery, in which a subset of connections and functional capability is iterated through the array.

Iterative arrays of units such as digital machinery or computers are well known and have many advantages, including the ability to perform many functions simultaneously, economies associated with iteration of a single, flexible, powerful, mass-produced part, and simple structure conducive to powerful manipulation. Such arrays, and the arrays of this invention, are not limited to electronic machinery, but may, for example, include magnetic, optic, or other machinery. Silicon, bubble integrated optics, Josephson and other technologies may be employed in the arrays. In digital arrays binary or other operating modes may be employed.

Prior arrays suffer from one or more of the following disadvantages: complex, expensive, and inflexible wiring arrangements, including, inter alia, permanent signal lines running through a multiplicity of units (with the accompanying disadvantages of the failure of such lines, increased noise considerations, and delays in long signal lines); an inordinate number of mechanically performed functions such as testing and fault avoidance; size limitations dictated by the need for packaging perfect arrays only; involvement of an unduly large number of units in the performance of certain functions; and inflexibility and complexity of loading arrangements, including restriction to the loading of many units simultaneously and the inability to reload certain units without reloading others (for example, in the array of U.S. Pat. No. 3,473,160, issued to Wahlstrom on Oct. 14, 1969).

SUMMARY OF THE INVENTION

It is accordingly a principal object of the invention to provide improved programmable arrays which overcome or avoid the disadvantages of prior arrays.

A further object of the invention is to provide arrays of iterative units in which a programming or loading path may be established selectively through a series of units, each unit being loaded via the previous units in the path and extending the path to a subsequent unit selectively.

Another object of the invention is to provide programmable arrays in which the loading path may be totally retracted or incrementally retracted (unit by unit) or in which the unit constituting the tip of the loading path may be reloaded, selectively.

Still another object of the invention is to provide programmable arrays in which loading paths may be established with great flexibility and in which the loading of selected units does not require the simultaneous loading of other units.

A further object of the invention is to provide programmable arrays in which the units are capable of determining automatically when loading is complete and thereupon selecting a further unit to be loaded depending upon the loading information.

Another object of the invention is to provide improved iterative arrays in which defective units are easily circumvented.

Yet another object of the invention is to provide improved iterative arrays in which test connections are readily established to and from a unit to be tested.

Briefly stated, a preferred embodiment of the invention employs iterative programmable digital units. Each unit includes digital circuits (such as shift-register) for performing processing functions, function-specification bits specifying the particular processing function performed in the unit, and further digital circuits constituting a loading mechanism with associated loader state bits. The units may be arranged in a checkerboard or other array, so that each of the units, except the outer units of the array, has adjoining units at the respective edges thereof. Sets of input and output connections are provided at each edge of the units so that each unit may, when properly programmed, transmit signals to the adjoining units and receive signals therefrom and so that signals may be transmitted to and from the array externally. An array programmer may be connected to one edge of a unit, termed the "base" unit, and the loader state bits and function-specification state bits of the base unit may then be loaded by the array programmer. The loading mechanism of a unit automatically determines when these state bits have been fully loaded, and also may uniquely select, on the basis of the loader state, a particular discrete adjoining unit to receive loading information via the loaded unit. The loading path is extended directly from unit to unit in accordance with the loading information supplied by the array programmer. Thereafter the loading path may be retracted in accordance with information supplied from the array programmer, leaving the processing digital circuits of the programmed units ready to perform processing functions determined by the state of the function-specification state bits. The units may be programmed so as to circumvent defective units or to establish test connections to a unit to be tested.

BRIEF DESCRIPION OF THE DRAWINGS

The invention will be further described in conjunction with the accompanying drawings, which illustrate preferred and exemplary embodiments, and wherein:

FIG. 1 is a diagrammatic view of a two-dimensional array in which the present invention may be incorporated;

FIG. 2 is a diagrammatic view illustrating the input and output connections to a unit of the array of FIG. 1;

FIG. 5 is a diagram illustrating the manner in which a loader path may be extended through a plurality of units to load information in the units from an array programmer;

FIG. 6 is a waveform diagram illustrating pulse signals for loading certain information;

FIG. 7 is a diagram illustrating incremental retraction of a loading path;

FIG. 8A is a diagram illustrating the processing function paths of a particular cell after programming;

FIG. 8B is a similar diagram illustrating by abbreviation the processing function paths;

FIGS. 9A–9P are diagrams similar to FIG. 8B illustrating different processing function paths;

DETAILED DESCRIPTION OF THE INVENTION

Figure 3:
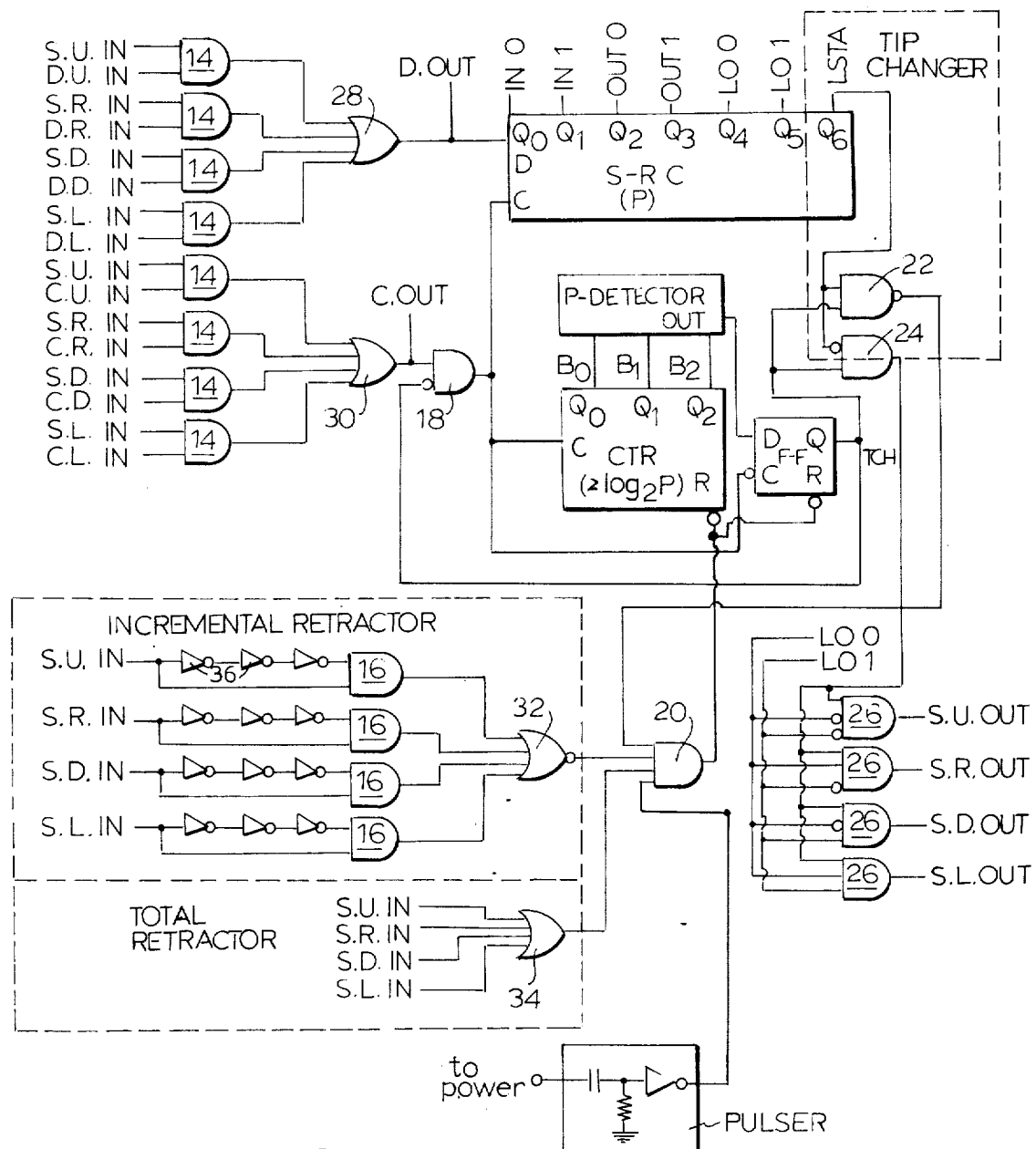
FIG. 3 is a logic diagram illustrating a loader mechanism and function-specification state bits of a unit in accordance with the invention.

The present invention is applicable to arrays of many different types and dimensions (especially integrated circuit arrays), but for purposes of illustration the invention will be described in its application to a two-dimensional array of cells (identical units of an array), each of the cells containing processing digital circuits, function-specification state bits, and loader digital circuits employed in programming the function-specification state bits and in controlling the extension of loading paths to other cells. As shown in FIG. 1, the array 10 comprises a plurality of cells 12, each of which has at the respective edges thereof sets of input and output lines, designated by the double arrows, by which connections are made between adjoining cells and between a cell and the external environment.

FIG. 2 illustrates a typical cell and shows the input and output lines in greater detail. Each cell has input and output lines at the upper side (U.IN and U.OUT), at the right side (R.IN and R.OUT), at the lower or down side (D.IN and D.OUT), and at the left side (L.IN and L.OUT). Each set of input and output lines is labeled N, R, K, D, C, and S, lines N, R, and K being the processing inputs or outputs and D, C, and S being the loader inputs or outputs. The inputs at any cell edge are uniquely connected to the corresponding outputs of the discrete adjoining cell at that edge, and vice versa. There are no signal buses (signal lines, not power lines) connecting more than two units or cells.

Wahlstrom (U.S. Pat. No. 3,473,160) and others have discussed programmable arrays, in which each cell of the array includes a memory containing function-specification state bits affecting which of several operations of the cell is to be performed. Both cells and arrays are viewed as having two functional layers—a loading layer and a processing layer—with distinct inputs, outputs, and memory elements for each layer. Of course, these layers may be physically intertwined. The processing layer of an array is used to provide the functions of the array that are immediately useful to an array's user. The processing layer's output and state are a function of the processing layer's input and state, and of the function state - the state of the function-specification state bits. The function-specification state bits may enter a particular function state when an array is powered on; after this, they may only be loaded through use of the array's loading inputs. The sole function of the loading layer is to laod these bits, and thereby affect the function performed in the processing layer of the array. Thus, the function-specification bits act as intermediaries between the loading layer and the processing layer. The function-specification bits are the only cell logic elements that are not in either layer. Typical use of an array involves loading the function-specification state bits, thereby specifying some function state affecting processing outputs. Then the loader may be queiscent while the processing layer performs its function. Reuse of the loader may re-program the processing layer to provide some new function.

In the prior art two common methods are employed for loading the function-specification state bits contained in a shift-register in a cell. In one method each of the shift-registers forms a part of a larger shift-register extending from cell to cell, and information can only be loaded by shifting operations affecting all of the cells in the large shift-register, requiring long busses, and long loading times. In a second method, such as disclosed in the Wahlstrom patent, there are a multiplicity of hard-wire orthogonal programming buses, and each cell is associated uniquely with a pair of said buses. The loading of a particular cell requires the application of pulses to programming lines serving rows or columns of cells, even though cells may be used to route programming pulses to certain buses. Of course, in more rudimentary fashion each cell could be programmed individually by the use of a mechanical probe connected to loader input terminals of the cell, but this is an expensive and cumbersome operation. The loader mechanism of the present invention overcomes the limitations of the prior art and has other advantages. Although additional logic elements in each unit of an array may be required, this requirement is not very disadvantageous, because the cost of logic elements is declining rapidly compared to other system costs.

The loader mechanism and function-specification state bits of FIG. 3 (which includes options to be described later) comprises a shift-register S-R C (memory), a counter CTR, a P-DETECTOR (which detects a particular condition of the outputs of the counter), a PULSER (so-labeled), a flip-flop F—F, AND gates 14-26, OR gates 28-34, and iverters 36. A circle symbol at an input or output connection of a logic element designates circle symbol at an input or output connection of a logic element designates a complementing input or output in the conventional manner. Shift-register S-R C contains the function-specification bits and loader state bits. The loader state bits are LO 0 and LO 1 (and LSTA when the TIP CHANGER option is used). S-R C may have any number of function-specification state bits; here we assume four such bis - IN 0, IN 1, OUT 0, and OUT 1. In the embodiment shown, shift-register S-R C is a seven bit serial-input, parallel-output register which shifts upon the positive-going transition of clock pulses applied to its C terminal in a conventional manner. Counter CTR counts the number of bits shifted into S-R C after a cell is activated for loading. Since CTR must be able to count to P, the number of bits in S-R C, CTR is at least $\log_2 P$ bits. The P-DETECTOR outputs a 1 when CTR's count is P. Here Counter CTR is a resettable 3-bit binary counter reset by a low voltage condition at its terminal R and changing state on negative-going transitions of clocks applied to its terminal C. Flip-flop F—F resets when the voltage at its R terminal is low, resetting signal TCH at its output Q to zero. When the voltage at its R terminal is high (1) as it usually is, Q assumes the value of the signal at its D terminal when the clock at its C terminal goes from low to high (positive-going transition of clocks). The counter CTR, the P-DETECTOR and flip-flop F—F are used to determine when a cell's shift-register S-R C has been loaded.

The operation of the loader mechanism of FIG. 3 will first be described without reference to the optional INCREMENTAL RETRACTOR, TOTAL RETRACTOR, and TIP CHANGER. When an option is not used, it is assumed that the gates in the inputs and outputs connected with the option are eliminated. If the resultant circuit has an AND gate with only one input, that gate is replaced by a wire. If the TIP CHANGER is not used, LSTA is not necessary. Consequently, S-R C is 6 bits, P is 6, CTR is 3 bits, and the P-DETECTOR is a 6-detector. (In this case, the P-DETECTOR performs the function OUT=B2 and B1 and not B0.) The basic loader allows the loading of the function-specification state bits of cells via a flexible loading path, or arm.

The basic loader operates in the following way. When power is supplied to the array, the PULSER produces a negative pulse to reset counter CTR and flip-flop F—F to zero. All inputs to the cell are at 0. Assume that S.L. IN goes from 0 to 1. The cell may be said to have been "touched" from the left, and the loader is activated. This prepares S-R C to be loaded via D.L. IN and C.L. IN. Since all other S. INs are 0, all other loader inputs to the cell are inactive. This causes D.L. IN to be relayed to D. OUT and C.L. IN to be relayed to C. OUT, at all edges of the cell. Besides being the D outputs of the cell, D. OUT is the D input to S-R C. Since TCH=0, positive transitions of C. OUT clock S-R C and CTR via AND gate 18. The first positive transition of C.L. IN causes a. D.L. IN to be shifted into S-R C, and b. CTR to be incremented to [B0 B1 B2]=[1 0 0]. During loading of the cell, CTR functions to count the number of positive C. IN transitions since the cell was touched; that is, it counts the number of bits shifted into S-R C. Succeeding C.L. IN positive-transitions will similarly shift information into S-R C and increment CTR. The Pth such transition (6th in this example) causes a. the 6th D.L. IN bit to be shifted into S-R C, so that all the information in S-R C has been loaded from C.L. IN since S.L. IN went high, and b. CTR = [0 1 1]. This causes the output of the P-DETECTOR to go high. Thus S-R C has been loaded with function-specification and loader state bits. The P-DETECTOR signals this fact by sending a high signal to the input to flip-flop F—F. When C.L. IN next goes from high to low, TCH goes high. This causes a. the C inputs of S-R C and CTR to remain low and high, respectively (C. OUT is no longer transferred to them), and b. one and only one S. OUT to go high, thereby activating inputs at the edge of some neighbor cell; the one selected is determined by LO 0 and LO 1.

At this point the loading of the loader mechanism of FIG. 3 is complete, and the states of the function-specification state bits IN 0, IN 1 and OUT 0 and OUT 1 and the loading bits LO 0 and LO 1 (the outputs of S-R C) have been determined by the loading information supplied at the D input of a selected edge of a cell. The S output, determined by the state of bits LO 0 and LO 1, determines the next cell to be programmed.

Referring to FIG. 5, an array is shown comprising four cells which may be designated by X and Y coordinates as cell (0 0), cell (0 1), cell (1 1), and cell (1 0). It may be assumed that each cell has a loader mechanism of the type shown in FIG. 3 and that the loader mechanism of cell (0 0) has just been loaded in the manner described above from an ARRAY PROGRAMMER. For example, the ARRAY PROGRAMMER may apply the pulse sequence shown in FIG. 6 [0, 0, 0, 1, 0, 0] to load S-R C of cell (0 0) with [IN 0 IN 1 OUT 0 OUT 1 LO 0 LO 1] = [0 0 1 0 0 0]. The ARRAY PROGRAMMER may be any conventional device for supplying a voltage at line S, clock pulses at line C, and data pulses at line D, which in the form shown are connected to the corresponding left inputs of cell (0 0). The ARRAY PROGRAMMER may, for example, be a conventional digital computer, but may be simply a device which supplies the voltages and pulses noted previously in the desired sequences.

Cell (0 0), which is the first loaded cell, may constitute the base of a loading arm or loading signal path extended from cell to cell, as indicated by the arrow LA in FIG. 5. To extend the loading arm, a cell, after it is loaded, may touch any cell other than a cell already in the loading arm. In the example shown in FIG. 5, when cell (0 0) has been loaded, its S.U. OUT goes high (determined by LO 0 and LO 1), so that cell (0 1) is touched and its S.D. IN goes high. Because S.L. IN is still the only high S. IN of cell (0 0) it is still true for that cell that C. OUT = C.L. IN and D. OUT = C.L. IN. Because cell (0 1) is the only cell that cell (0 1) is touching, cell (0 1) is the only neighbor of cell (0 0) to accept C and D information from cell (0 0). Cell (0 1) can now be loaded in the same way that cell (0 0) was. After it is loaded, cell (0 1) can now touch some new neighbor (determined by LO 0 and LO 1), such as cell (1 1), and funnel loading ainformation to this new tip of the loading arm LA. The process then continues, with cell (1 0) being loaded via cell (1 1). In this way a loading arm may be snaked through an array from cell to cell, its length being limited only by the size of the array. Loading information is transmitted from one cell to another directly, with a delay no greater than the delay through two gates.

The retractor options in FIG. 3, which enhance the capability of the basic loader mechanism, can now be considered. The TOTAL RETRACTOR allows a loading arm to be grown and later totally retracted by a signal at the base of the loading arm. This allows, for example, reloading of cells and re-routing of a loadng arm to new cells from the same arm base. For example, assume an array is loaded as described above. Assume that the loading arm LA of FIG. 5 exists. If the ARRAY PROGRAMMER lowers its S line, no S. IN of cell (0 0) is high. Thus, as is apparent in FIG. 3, the input from the TOTAL RETRACTOR to AND gate 20 goes low, and the resultant low output of AND gate 20 resets counter CTR and flip-flop F—F. When TCH goes low, all S. OUTs of cell (0 0) go low. This resets cell (0 1), which resets cell (1 1), which resets cell (1 0). The function-specification state bits of these cells are not affected. The TOTAL RETRACTOR thus allows the resetting of all the cells in the loading arm by lowering the S input to the base of the arm. The reset cells are then ready to be reloaded by some new loader arm.

The INCREMENTAL RETRACTOR, which in the form shown is associated with the TOTAL RETRACTOR, allows a loading arm to be shortened cell-by-cell, instead of all at once as with the TOTAL RETRACTOR. This can save time when, for instance, one wants to change the state of a cell that is near the tip of a long loading arm. Consider the long loading arm LA of FIG. 7. If the ARRAY PROGRAMMER wants to reload cell (99 0), as it might on the basis of some test on cell (100 0), cell (100 0) can be loaded with information telling it to touch left. When S.R. IN of cell (99 0) goes high, the INCREMENTAL RETRACTOR of cell (99 0) would create a reset pulse. This would reset cell (99 0) for subsequent loading from cell (98 0) Resetting of cell (99 0) would also remove cell (100 0) from the loading arm. This incremental retraction is much faster than the equivalent action of total retraction and subsequent growth of the loader arm from (0 0) to (99 0).

The TIP CHANGER allows the same cell to repetitively loaded by the same loading arm. This is another time-saving device, particularly helpful when one wants to test the same cell in various states. It involves adding an extra bit to S-R C, and consequently requires one more clock pulse for the loading of a cell. If the tip cell is loaded with LSTA = 1, the downward C. IN transition right after the P-DETECTOR goes high causes resetting (via AND gate 22) of CTR and TCH to CTR = TCH = 0. The fact that LSTA is high also prevents the cell from touching any other cell (output of AND gate 24 goes low). Thus the cell is loaded with function-specification information, remains the loading tip, and is therefore ready to be immediately reloaded. If the cell is loaded with LSTA = 0, it may touch another cell as if no TIP CHANGER existed.

Figure 4:
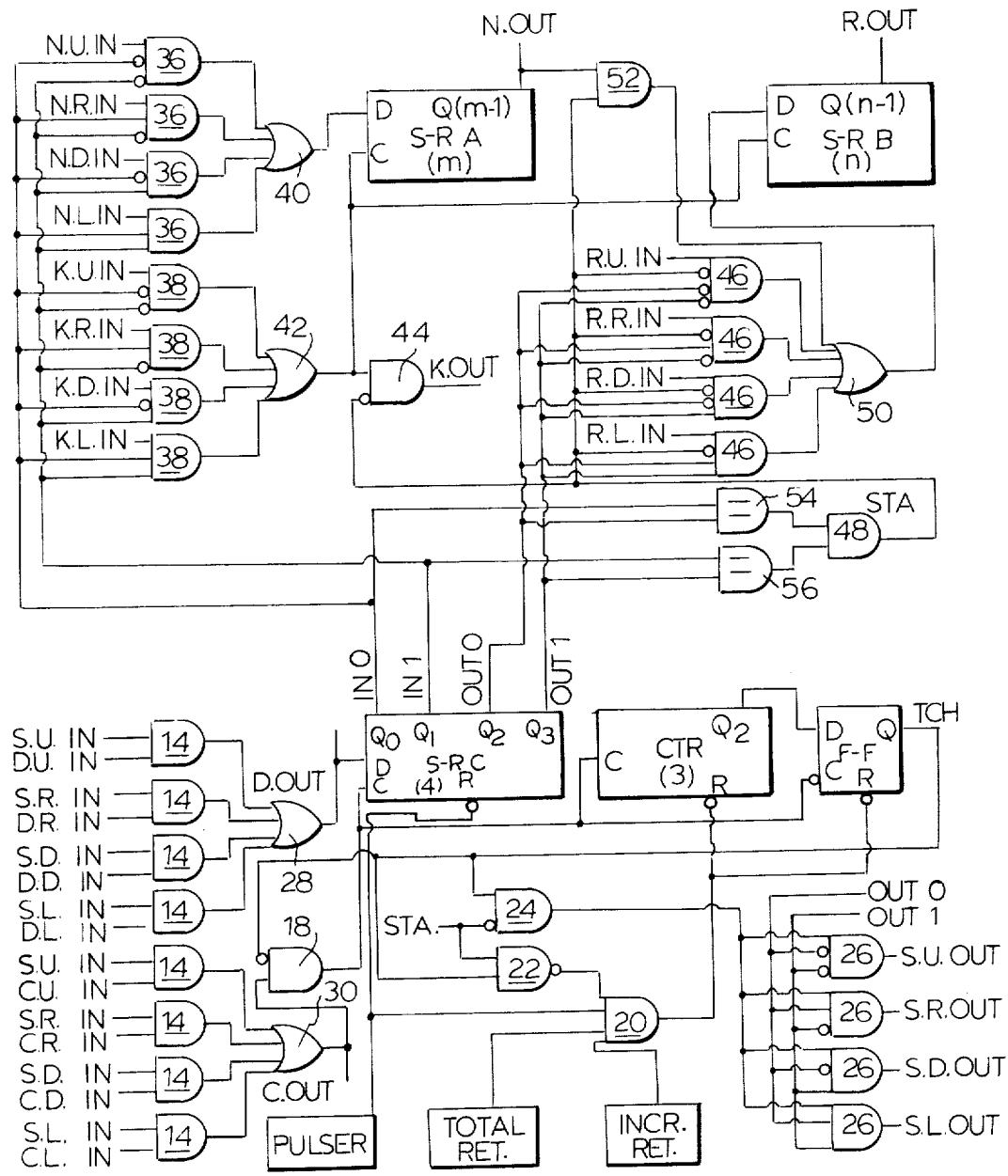
FIG. 4 is a logicdiagram illustrating a complete unit, including loader logic, function-specification state bits and processing logic in accordance with the invention.

FIG. 4 illustrates one example of a complete cell with the options of FIG. 3, the TOTAL RETRACTOR (TOTAL RET. and INCREMENTAL RETRACTOR (INCR. RET.) being shown in block diagram form. The Pulser's output is shown connected to the reset input of S-R C, so S-R C is initialized when power is turned on; this connection is useful for some processing mechanisms, such as this one. The loader of FIG. 4 permits a reduction of circuitry and loading time by using bits in S-R C in a dual role as function-specification and loader state bits. In the embodiment of FIG. 4, signal lines OUT 0, OUT 1, and STA perform the functions of bits LO 0, LO 1, and LSTA, respectively, of FIG. 3. It will be noted that the shift-register S-R C is a 4-bit register and that only the output Q2 of the couner CTR is used.

The processing layer's logic includes shift-registers S-R A and S-R B, of arbitrary length (only the last output of the register being available) and associated gates. The N input lines are connected to AND gate 36, which also receive inputs from outputs IN 0 and IN 1 of shift-register S-R C. The K input lines are connected to AND gates 38, which also receive inputs from outputs IN 0 and IN 1 of shift-register S-R C. The outputs of AND gates 36 are connected through OR gate 40 to the D input of shift-register S-R A, while the outputs of AND gates 38 are connected through OR gate 42 to the C input of shift-register S-R A and to the C input of shift-register S-R B. The output of OR gate 42 is also connected to AND gate 44, which supplies clocks K to all of the K output lines of the cell provided that STA is low. The R inputs are connected to AND gates 46, which also receive inputs from OUT 0 and OUT 1 of shift-register S-R C and from AND gate 48.

The function-specification bits IN 0, IN 1, OUT 0, and OUT 1 determine the inputs to S-R A and S-R B. IN 0 and IN 1 specify the input-output set that transmits its N input to the D input to S-R A, and its K input to the C inputs of S-R A and S-R B. STA is high if and only if IN 0 equals OUT 0 and IN 1 equals OUT 1. OUT 0, OUT 1, and STA specify the D input to S-R B. If STA is high, the output of S-R A is the D input to S-R B. Otherwise the D input to S-R B is the signal from the R input selected by OUT 0 and OUT 1, via AND gates 46 and 50. N and R outputs to all sides of the cell are obtained from S-R A and S-R B, respectively. In general, arrays are programmed so that working cells have at most one K. IN that is not 0.

Cells may be used to form shift-register arms. Information in an arm flows from the base of the arm via K and N lines to the arm's tip, turns, and flows back to the base via the R lines. The cell at the tip of the arm has STA = 1. This cell acts as a loop; it forms shift-register A and shift-register B into one shift-register, with the same cell providing K and N inputs to this shift-register, and receiving the Return (R) output of this shift-register. All non-tip cells in the arm have STA = 0. Each of these cells receives K. IN and N. IN information from a cell in the arm nearer to the arm base, and transmits R. OUT information to that cell. Each of these cells also outputs N. OUT and K. OUT to a cell in the arm nearer to the arm tip, and receives R. IN information from that cell.

FIG. 8A shows the important processing paths of a cell for a particular non-tip processing function state. Since a useful shift-register cell is always part of a shift-register arm, only the processing inputs and outputs connected to neighboring arm cells are shown. It is apparent that the processing outputs depend only on the function state, the processing state, and processing inputs. FIG. 8b illustrates the same function state as in FIG. 8A, but in abbreviated form. The short arrow indicates the input-output set providing K and N inputs for S-R A. FIGS. 9A–9P illustrate in abbreviated form all processing function paths established by the function-specification state bits IN 0, IN 1, OUT 0, and OUT 1, the state of these bits being indicated above each figure.

Figure 10A:
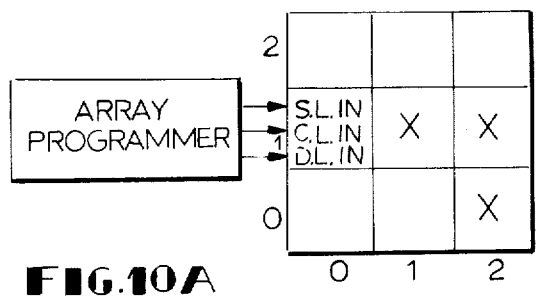
FIGS. 10A-10C are diagrams illustrating the manner in which processing function paths may be established in an array to circumvent defective units.
Figure 10B:
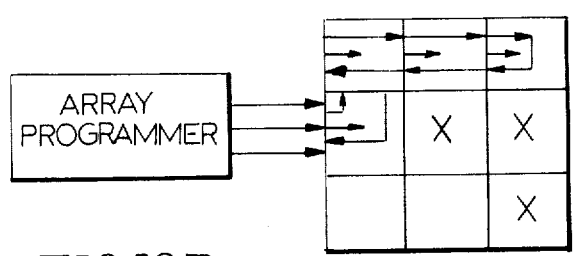
Figure 10C:
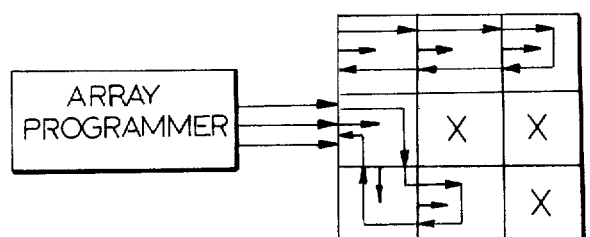

FIGS. 10A–10C illustrate the manner in which an array, such as an integrated circuit array, can be loaded to provide two shift-register arms, while circumventing defective cells (designated by an X). In the example the ARRAY PROGRAMMER inputs to cell (0 1). Assume that all S. INs of working cells are 0. The ARRAY PROGRAMMER then raises the S.L. IN line of cell (0 1) to 1. This prepares this cell to receive C and D signals from its activated left edge. The sequence 0, 0, 1, 1 is first entered from the ARRAY PROGRAMMER causing the IN 0, IN 1, OUT 0, OUT 1 bits of cell (0 1) to assume the state [1 1 0 0] and causing cell (0 2) to be touched. The sequences 0, 1, 1, 1; 0, 1, 1, 1; and 1, 1, 1, 1 are then supplied by the ARRAY PROGRAMMER, properly loading cells (0 2), (1 2), and (2 2). The array would then be in the function state shown in FIG. 10B. Note that a shift-register with inputs and outputs at the left edge of cell (0 2) is formed. The inputs are K.L. IN and N.L. IN, and the output is R.L. OUT. A new loading arm is then formed to load a second shift-register into cells (0 1), (0 0), and (1 0). Either the TOTAL RETRACTOR or the INCREMENTAL RETRACTOR may be employed to allow re-use of cell (0 1) as a loading arm base. The S.L. IN of cell (0 1) is lowered to 0. This frees the loading arm's base, but leaves intact the function-specification state bits of the cells in the shift-register arm. The same S.L. IN is then raised, preparing cell (0 1) for new loading information. The sequences 1, 0, 1, 1; 0, 1, 0, 0; and 1, 1, 1, 1 are then entered. This causes a second shift-register to be loaded into the array as shown in FIG. 10C. Then the S.L. IN of cell (0 1) is again lowered, leaving two working shift-register arms in a flawed array. The inputs and outputs of these shift-registers may be connected to the extra-array environment. S, C, and D inputs to some cell such as (0 1) may be brought out of the array to allow repairability of the array.

Figure 11A:
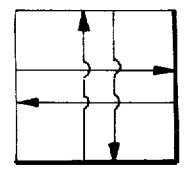
FIGS. 11A-11D are diagrams illustrating test connections that may be established for the testing of a unit.
Figure 11B:
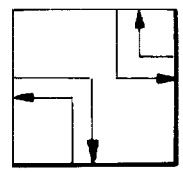
Figure 11C:
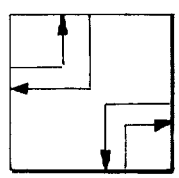
Figure 11D:
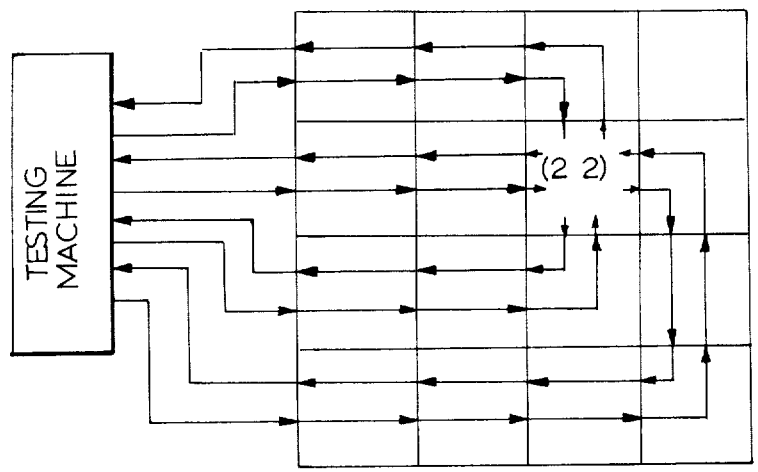

FIGS. 11A-11D illustrate the manner in which the invention may be employed to test defective units in an arbitrarily large array of two or mre dimensions, the tested unit having *m* processing outputs at each edge, with each output a function of the (4 × *m*) processing inputs, the function state, and the processing state. Although array cells have been tested by prior methods in which signals are transmitted to and from a cell via probes lowered onto bonding pads for each cell, the present invention permits each unit of an array of arbitrary size to be tested by transmitting signals through a small number of cells, with consequent economy, density, test speed and repairability advantages, especially in integrated circuits. The testing machine shown in FIG. 11D may be any conventional testing device, such as a programmer computer, to send signals into a few units and observe the output of the same units. Logical wires or paths are grown as shown in FIG. 11D from the testing machineto a cell to be tested, such as cell (2 2), by employing the loading techniques described previously. Each cell forming part of a wire is placed in a function state such that it passes at least one input unchanged out some output after some delay. Of course, temperature, power supply, noise environment, etc., may be varied while this functional testing is proceeding. If one wanted to test a unit in various function states, the loading mechanism for that unit could allow the unit to be forced into the desired states, other units being employed to route signals between the testing machine and the unit under test. FIGS. 11A-11C show various function states of cells which may be employed to provide the desired test wires. In the figures an arrow indicates that each processing input at the base of the arrow is sent out a distinct processing output at the tip of the arrow.

Figure 12A:
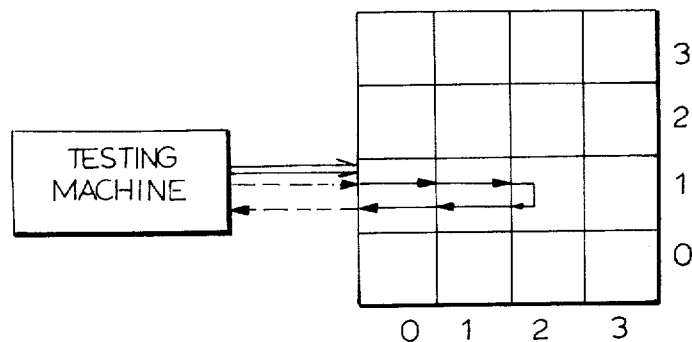
FIGS. 12A and 12B illustrate the manner in which units acting as test wires may be established and tested.
Figure 12B:
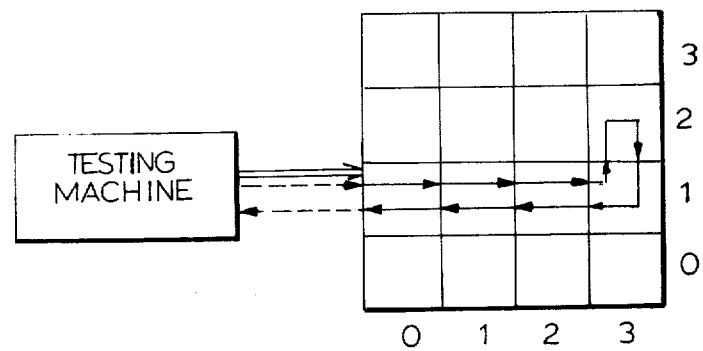

Of course, a unit that has not been fully tested will sometimes be needed to function as part of a test-wire for a unit to be fully tested. This is not a problem. A test-wire can be grown gradually, and its growth can be tested as often as desired during growth by, for instance, terminating the test-wire with a loop. FIGS. 12A to 12B illustrate the growing and testing of a wire. In FIG. 12A the wire has been grown to cell (2 1) and a loop formed thereat for the transmission of a signal to and from the testing machine. The double arrows from the testing machine represent the loading lines to the base cell. In FIG. 12B the wire has been extended to cell (3 2) and a loop formed thereat for the transmission of testing signals to and from that cell. The wire is judged good, of course, if a signal can travel up the bus, move through the loop and return back down the bus unchanged after some appropriate delay. The loading mechanism itself can be implicitly tested as the testing machine tries to put units into distinct function states. Furthermore, since the loader mechanisms of the invention may be much simpler than the other mechanisms of the unit, the probability of the loader mechanism malfunctioning may be negligibly small.

Figure 13:
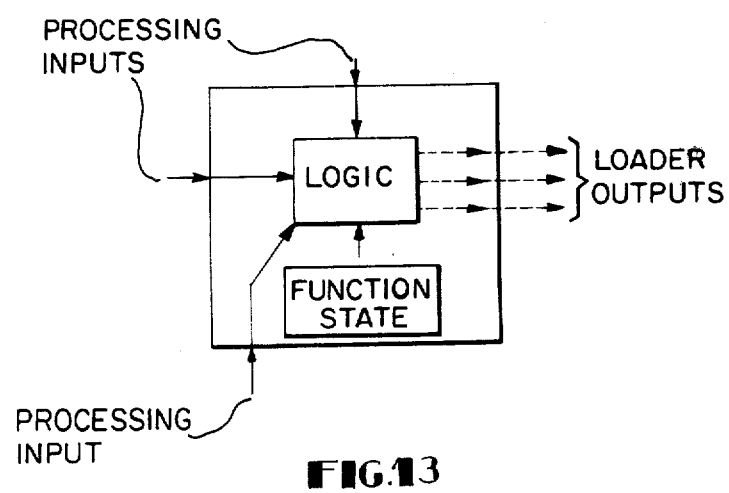
FIG. 13 is a diagram illustrating the manner in which processing inputs and outputs of a unit may control loading of an array.

One of the advantages of the invention is its great flexibility. FIG. 13 illustrates a cell in which the function state is such that processing inputs from one or more input-output sets are transmitted as loader outputs at some other input-output set. This allows a machine embedded in the processing layer to access loader lines, and thereby load units in its array environment. When the units of the array can support testing and fault-avoidance, a processing machine in the array can load and test units and embed perfect machines in a faulty array. The machine could, for instance, construct other machines to work on specific problems and could later reclaim unit-array space for new machines. Two or more machines could monitor and repair each other.

While preferred embodiments of the ivnention have been shown and described, it will be apparent invention those skilled in the art that changes can be made in these embodiments without departing from the principles and spirit of the invention, the scope of which is defined in the appended claims.

The invention claimed is:

1. An array comprising iterative units in which each of said units includes memory means, plural input and output means, means for storing information in the memory means from selected input means, means dependent upon the information stored in said memory means for selecting output means, and means for transmitting information from selected input means through said unit to the selected output means, each iterative unit having particular output means uniquely connected to particular input means of other predetermined iterative units discretely, whereby the selection of a particular output means of a unit permits the transmission via that unit of information to be stored in a selected discrete other unit.

2. An array in accordance with claim 1, wherein said memory mens includes a plurality of registers, one of which has means for selecting the output means of the cell and has means for selecting the input means connected to another register.

3. An array in accordance with claim 1, wherein said iterative units comprise cells, each cell having a plurality of sets of input means and output means, particular output means being uniquely connected to particular input means of neighbor cells discretely.

4. An array in accordance with claim 1, wherein said units are functionally identical units.

5. An array in accordance with claim 1, wherein said units are units of an integrated circuit.

6. An array in accordance with claim 1, wherein said units comprise programmable logic and wherein said information comprises programming information transmitted directly from unit to unit with a delay no greater than the delay through two logic gates.

7. An array comprising iterative units in which each of said units includes memory means, plural input and output means, means for storing information in the memory means from selected input mans, means dependent upon the information stored in said memory means for selecting output means, and means for transmitting information from selected input means through said unit to the selected output means, each iterative unit having particular output means connected to particular input means of other predetermined iterative units, whereby the selection of a particular output means of a unit permits the transmission via that unit of information to be stored in a selected other unit, said memory means including a plurality of registers, one of which has means for selecting the output means of the cell and has means for selecting the input means connected to another register, each unit having means for initializing said one register's condition and means for terminating the storage of information therein.

8. In an array of iterative units having means for storing information, means for loading information into a selected unit, and means in the loaded unit responsive to said loading for selecting uniquely a discrete another unit to be loaded through the loaded unit, each selected unit having means for selecting uniquely another discrete unit to be loaded therethrough.

9. An array according to claim 8, wherein each unit has means for establishing a loading path to any one of a plurality of other units selectively, and further comprising means responsive to information transmitted from unit to unit via said path for de-activating a unit, disconnecting it from its loading path, but leaving some of its stored information intact.

10. An array according to claim 9, wherein said loading path has a base at the first-loaded unit and a tip at the last-loaded unit, wherein loading information input to the base flows through the path and is stored in the tip, and wherein the disconnections change the length of said path.

11. An array according to claim 10, wherein said disconnecting means includes means to disconnect all units in said loading path substantially simultaneously.

12. An array according to claim 19, wherein said disconnecting means includes means to disconnect said units incrementally from said tip.

13. An array according to claim 10, wherein said disconnecting means includes means to change the unit constituting said tip.

14. An array according to claim 8, wherein each unit has means for determining when loading thereof is complete to terminate further loading.

15. An array in accordance with claim 8, wherein said units are functionally identical units.

16. An array in accordance with claim 8, wherein said units are units of an integrated circuit.

17. A method of forming a system from selected units of an array, comprising storing information in a first selected unit, uniquely selecting in response to the stored information a discrete second unit for receiving information via the first selected unit, and transmitting information to the second unit via the first unit.

18. A method in accordance with claim 17, further comprising establishing operating communication paths between selected units in response to information stored therein.

19. A method in accordance with claim 18, wherein said paths are established to circumvent defective units in said array.

20. A method in accordance with claim 18, wherein said paths are established to a unit to be tested via said paths.

21. A method in accordance with claim 17 further comprising storing in the second unit information transmitted thereto via the first unit, and uniquely selecting in response to the information stored in the second unit a discrete third unit for receiving information via the first and second units.

22. A method in accordance with claim 17, wherein said storing, selecting, and transmitting steps are performed in an integrated circuit.

23. A method of establishing and testing signal paths in an array of programmable iterative units, comprising programming certain units to serve as an input wire and an output wire, programming a unit to serve as a loop connecting the input and output wires, and testing the continuity of the signal path including the input wire, the loop, and the output wire.

24. A method in accordance with claim 23, wherein said programming and testing steps are performed in an integrated circuit.

25. An array comprising machine units in which each of said units has plural input and output sets with each such set connected, if at all, uniquely to a discrete unit or an extra-array machine, means for determining whether an input set is input-activated, means for storing information input from said input-activated set, means responsive to information stored to output-activate and output set, and means for subsequently transmitting information from the input-activated set to the output-activated set.

26. An array in accordance with claim 25, wherein a unit has means for assuming a state for causing information input to at least one input set of that unit to be supplied via an output set of that unit to the information storage means of another unit.

27. An array comprising iterative units in which each of said units includes memory means, plural input and output means, means for storing information in the memory means from selected input means, means dependent upon the information stored in said memory means for selecting output means, and means for transmitting information from selected input means through said unit to the selected output means, each iterative unit having particular output means connected to particular input means of other predetermined iterative units, whereby the selection of a particular output means of a unit permits the transmission via that unit of information to be stored in a selected other unit, said connection of particular output means to particular input means providing signal lines and there being no signal lines connecting more than two units.

* * * * *